United States Patent [19]

Swanson

[11] Patent Number: 5,422,565
[45] Date of Patent: Jun. 6, 1995

[54] METHOD AND SYSTEM FOR SENSING REMOVAL OF A UTILITY METER FROM ITS SOCKET

[75] Inventor: Scott C. Swanson, Roswell, Ga.

[73] Assignee: Schlumberger Industries, Inc., Norcross, Ga.

[21] Appl. No.: 163,215

[22] Filed: Dec. 7, 1993

Related U.S. Application Data

[60] Division of Ser. No. 77,258, Jun. 17, 1993, Pat. No. 5,293,115, which is a continuation of Ser. No. 741,006, Aug. 19, 1991, abandoned.

[51] Int. Cl.⁶ .................. G01R 21/06; G08B 21/00
[52] U.S. Cl. .................................... 324/110; 340/565; 340/568
[58] Field of Search ............... 324/110, 156, 157; 340/568, 637, 571, 572, 565, 568; 361/372; 364/481, 483, 550, 551.01

[56] References Cited

U.S. PATENT DOCUMENTS

| | | | |
|---|---|---|---|
| 4,331,915 | 5/1982 | Fielden | 324/110 |
| 4,571,691 | 2/1986 | Kennon | 364/483 |
| 4,665,359 | 5/1987 | Goodwin | 324/110 |
| 4,727,315 | 2/1988 | Jones | 324/110 |
| 4,833,455 | 5/1989 | Bishop | 324/110 |
| 5,017,877 | 5/1991 | Haus, Jr. | 324/110 |
| 5,086,292 | 2/1992 | Johnson et al. | 324/110 |
| 5,227,668 | 7/1993 | Mutch et al. | 324/110 |

Primary Examiner—Vinh Nguyen
Attorney, Agent, or Firm—Sanford J. Asman

[57] ABSTRACT

A method and system is disclosed for indication and prevention of tampering with an electricity meter having control circuitry for automatic remote reading. The control circuitry, provided externally of the meter in a base or base extension, to which the meter is connected, is also used for tamper detection. Embodiments of the invention include use of optical sensing, voltage detection and proximity detection. Ambient light sensing may be performed to detect separation of the meter from the external receptacle. Reflected light to a reflective surface of the meter is sensed to determine if the meter is properly engaged. Presence of a meter connection plug element may be sensed either optically or by position responsive switch. Voltage of the utility supply and meter user output may be monitored to determine tampering.

6 Claims, 3 Drawing Sheets

METHOD AND SYSTEM FOR SENSING REMOVAL OF A UTILITY METER FROM ITS SOCKET

This application is a division of U.S. patent application Ser. No. 08/077,258, filed on Jun. 17, 1993 (now U.S. Pat. No. 5,293,115), entitled METHOD AND SYSTEM FOR SENSING REMOVAL OF A UTILITY METER FROM ITS SOCKET which application was a continuation of Ser. No. 07/741,006, filed on Aug. 6, 1991, now abandoned.

TECHNICAL FIELD

The present invention relates to remote detection of unauthorized removal of an electricity meter from its socket in a plug-in base unit. More particularly, a sensing unit and a microprocessor, removed from the meter housing in an extension of the meter base, is provided to monitor presence or absence of the meter and to transmit a signal indicative of meter removal to a remote location.

BACKGROUND ART

Electricity meter reading technology has developed in recent years to include, in addition to traditional manual reading of a meter dial, a capability for remote reading. In a customary remote reading arrangement, optical sensing of the meter rotor is performed. Control circuitry is provided for sensor energization and detection, and correlation thereof to power usage. Signals indicative of power usage are transmitted to a remote location of the utility company.

Meters generally are enclosed as a unit within a housing which is provided with a plug to be inserted into a socket of a base. The meter is connected electrically between the utility company power supply side and the user, or customer, power supply side, both connections being made through the base. Such an arrangement is exemplified by U.S. Pat. No. 4,588,949, issued to Becker et al. on May 13, 1986. Automatic meter reading utilizing an optical shaft encoder with appropriate control circuitry is illustrated in U.S. Pat. No. 4,665,359, issued to Goodwin on May 12, 1987.

In recognition of the concern of electric utility companies to avoid the theft of electricity, some conventional meter systems include provisions for attempting to determine whether tampering with an electricity meter by unauthorized personnel has occurred. Electricity meters which contain electronic circuitry may contain a position sensitive switch to sense removal of the meter from its socket. The meter of the above-identified Becker et al. patent includes such a device. In the Becker arrangement, removal of the meter and reinstallation thereof actuates a solenoid which results in visual indication within the meter display of the unauthorized removal.

As meter reading systems have become more sophisticated, it has been advantageous to house the electronic control circuitry in the meter socket base or an extension thereof. Such placement enables easier access to the circuit elements in comparison to the enclosed meter housing which is preferably standardized and may be limited in space to include only the structural elements of the meter.

A disadvantage with the placement of electronic components in a base outside the meter is that no position sensitive switch, such as provided by the Becker device, or other tampering indicator is available in the meter. If a position sensitive switch is provided instead in the base, additional components must be made available for indication of the tampering condition. Moreover, a position sensitive switch, which can determine close structural engagement between the meter and base, would not indicate that the connection between meter plug and base socket is made in proper orientation. For example, if there is an unauthorized removal of the meter and then reinstallation in reverse connection, only the removal would be indicated. Power usage during such a connection would drive the meter rotor in a direction opposite to the appropriate direction. An actual decrease in the power usage display would occur. Manual meter reading by the utility company at a later time would not reveal this condition.

In the Goodwin meter, tampering is detected by comparing the quantity displayed with the encoded values in the optical encoders. Other tamper prevention or detection schemes involve visually discerning the rupture or breakage of a structural element, such as a lock or seal, associated with the meter housing and base. Discovery of tampering with such meters requires the physical presence of personnel at the meter sites, a disadvantage in terms of cost and time consumption.

DISCLOSURE OF THE INVENTION

Accordingly, an object of the invention is to enable remote detection of meter tampering with the efficient utilization of control circuitry used for power usage reading.

Another object of the invention is to enable detection of meter tampering by use of a sensing device and circuitry located outside the meter housing.

A further object of the invention is to sense removal of an unmodified electricity meter from a meter socket using sensors located within a meter socket base or socket base extension.

Yet another object of the invention is to provide a tampering indication if a meter is removed from its socket and a tampering indication also if the meter is reinstalled in reverse orientation, such provision being achieved with little or no modification of the meter structure.

The above and other objects of the invention may be satisfied by providing tamper sensing capability as part of an electricity meter reading system having a microprocessor controlled meter interrogation unit which is housed within a meter base extension. Such unit permits remote reading of the meter. Detection of removal of the meter from the meter base extension may be made in conjunction with additional means for detecting if the meter and meter base extension as a unit is removed from the socket in the meter base itself.

Tampering detection, using components external to the meter, may be undertaken in several specific embodiments. A first detection scheme according to the invention makes use of an optical sensing arrangement mounted within the meter base extension. Emitted light, directed to a reflective surface of the meter housing, is used by the control circuit microprocessor to determine the presence or absence of the meter. Only a portion of the meter housing surface is reflective, such portion positioned to face an adjacent light emitting source in the base extension only if the meter is connected with the base extension in the proper orientation. If the connection is reversed, the meter will be in an upside down position, the reflective portion being in non-alignment with the optical light path. In response to the optical sensor, a tampering indication signal is generated when the meter is not connected to the base extension and when the meter is connected in an improper manner.

In another embodiment of the present invention, a bayonet type plug and bayonet guard is provided to permit connection between meter and base extension only in the appropriate orientation. An optical emitter and detector pair is provided in the base extension to establish a light path which, when connection between meter and base extension is made, includes the bayonet or bayonet guard positioned to block emitted light from the detector. Removal of the meter from the extension base permits the emitted light to be sensed and, thereby, tampering to be detected. Alternatively, the optical elements may be replaced by a switch located in the base extension which is responsive to insertion or removal of the bayonet plug. The switch either opens or closes a sensing circuit to indicate tampering.

Where minimization of the number of circuit components and cost are dominant considerations, an embodiment of the invention provides an optical detector placed in the meter base extension. If the meter is removed, ambient light is sensed, indicating meter tampering.

In an alternative arrangement of the invention, a determination of tampering is made by sensing a lack of voltage at the meter, or user side, while concurrently sensing a voltage applied at the utility company side. Such detection indicates removal of the meter. As the meter interrogation unit, used normally to determine power usage reading, derives its power from the utility side the supply voltage thereof can be readily determined.

In an additional embodiment of the invention, the electronic circuit in the meter base extension includes a metal detector which detects the proximity of the meter frame.

Additional objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
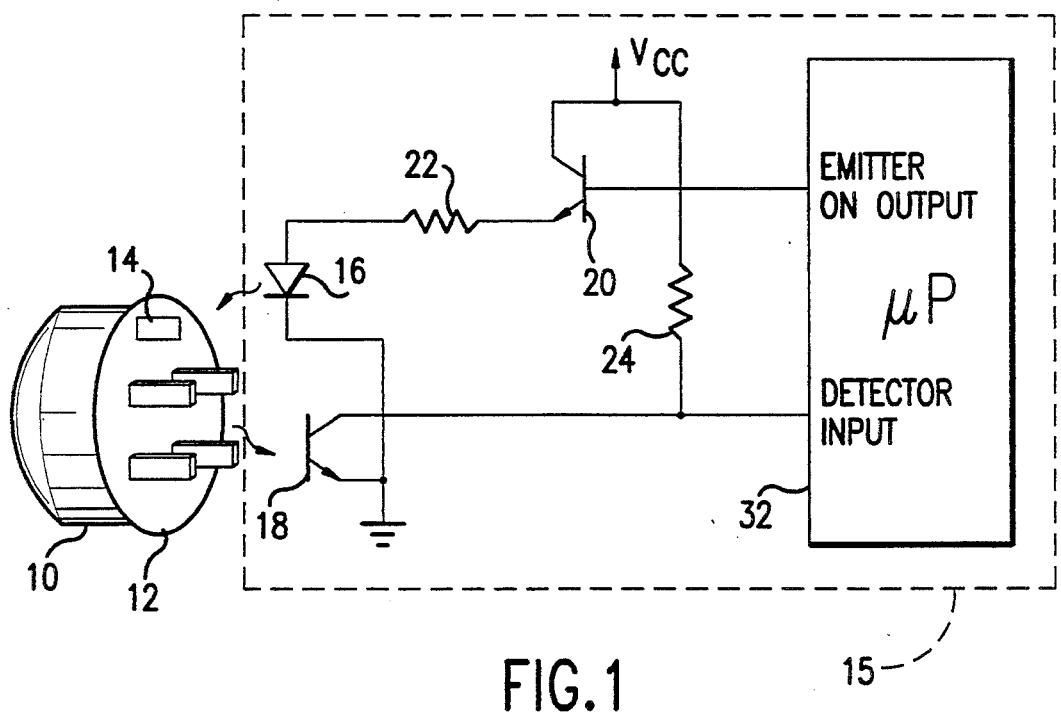
FIG. 1 is a schematic diagram of a first embodiment of a meter tampering detection circuit, according to the invention, illustrating an optical sensor unit situated external to the meter whereby emitted light is directed to a reflective surface of the meter housing.

FIG. 1 illustrates a first embodiment of the invention wherein the meter tampering circuit is provided external to the meter housing. The electricity meter is contained in a housing 10. The back plate of the meter housing 12 includes plug extensions provided to mate with a socket, not shown, in a base extension. A reflection surface 14 is provided on a portion of the back plate.

The tampering detection circuit 16 is included entirely within the base or base extension and external to the meter. A sensing unit includes light emitting diode 16 and phototransistor 18. The light emitting diode 16 is connected between a voltage supply $V_{CC}$ and ground through a series connection of switching transistor 20 and resistor 22. The phototransistor 18 is connected between the voltage supply $V_{CC}$ and ground through the series connection of resistor 24.

An output of microprocessor 32 is connected to supply driving signal pulses to the switching transistor 20. The sensor output voltage, which is the voltage at the junction of resistor 24 and phototransistor 18, is directly connected to a detector input terminal of microprocessor 32. The microprocessor provides functions in addition to tamper detection which are not aspects of the present invention, such as meter usage reading and remote transmission signals indicative of power usage reading.

The application of driving pulses to transistor 20 enables the emission of light pulses by the light emitting diode 16. If the meter is connected with the base extension in the proper orientation, the light pulses are reflected by the reflective surface 14 to the phototransistor 18. Light pulses sensed by the phototransistor 18 render it conductive in a saturated mode, thereby connecting the detector input of the microprocessor to ground. Nonconduction of the phototransistor effectively disconnects the microprocessor input from ground, whereby the supply voltage is applied to the detector input of the microprocessor. The signal at the detector input terminal, therefore, is a bilevel logic signal.

If the meter is removed from its socket in the base extension, light pulses will not be reflected to the phototransistor. Likewise, if the meter is installed in the upside down position, there will be no light reflection to the phototransistor as the reflective portion 14 of the meter back plate is not in the light path of the emitted pulses in such a connection. Many standard meters include an optically reflective hanger appropriately located. Such hangers may be used for the reflective surface 14 without need to provide additional modification to the meter.

The voltage at the microprocessor detector input is sensed during both the on periods and the off periods of the emitter driving pulses. Such operation ensures accurate tampering detection during both daytime ambient light conditions and nighttime ambient light conditions. If the meter is removed during a period of high ambient light, light will be sensed during the off periods of the emitter driving pulses. Such sensing indicates tampering as the meter, in the connected state, obstructs ambient light from the phototransistor. If the meter is removed during a period of low ambient light, the absence of light will be sensed during the on periods of the emitter driving pulses as the light emitting pulses are not reflected to the phototransistor. Such sensing is also a tamper indication. The same results are obtained if the meter is reconnected with the base extension in an upside down orientation. The voltage applied to the microprocessor input is indicative of the sensed condition of the optical sensing unit.

Figure 2:
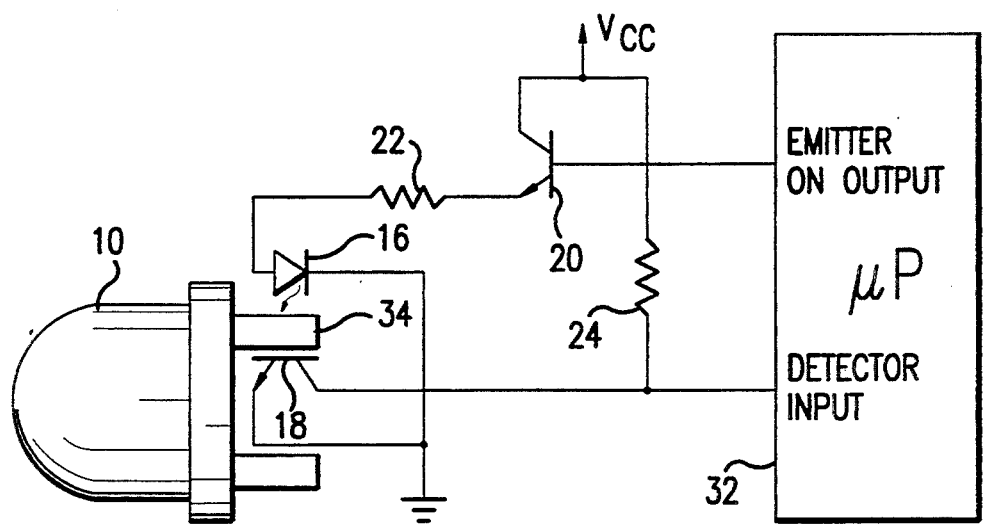
FIG. 2 is a schematic diagram of a meter tampering detection circuit according to the invention, illustrating an external optical sensor unit external to the meter which detects the presence or absence of the meter connection plug.

FIG. 2 illustrates an alternative embodiment. A bayonet type plug and bayonet guard are provided to permit connection between meter and base extension only in the appropriate orientation. Phototransistor 18 is positioned to be directly in the light path of light emitting diode 16, both within the confines of the base extension. Plug element 34 obstructs the light path when the meter plug is inserted in the base extension socket. Detection at the microprocessor input of a voltage representing impingement of the emitted beam or ambient light at the phototransistor is indicative of meter tampering.

Figure 3:
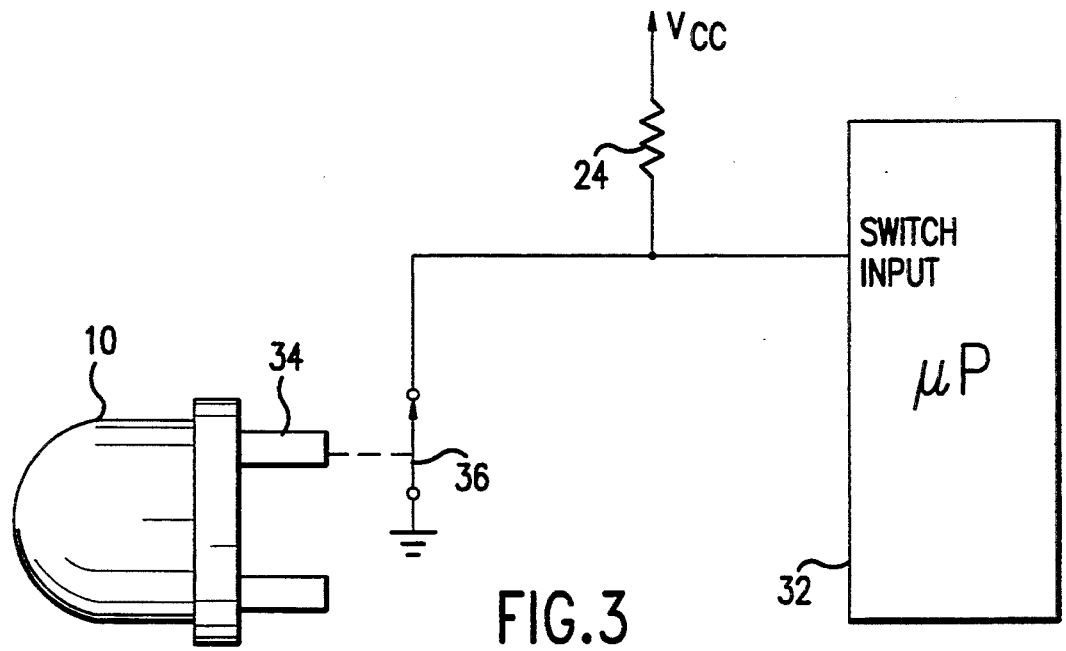
FIG. 3 is a schematic diagram of a meter tampering detection circuit according to the invention wherein a switch in a sensing circuit is actuated by the meter connection plug.

In the embodiment of FIG. 3, the optical sensing unit is replaced by a switch 36, the position of which is dependent upon the plug element 34. Switch 36 is normally closed and is part of a series electrical connection which also includes the supply $V_{CC}$, resistor 24 and ground. The microprocessor input is connected to the junction between the resistor 24 and one terminal of the switch. The arm of switch 36 is positioned within the base extension to be in the open circuit condition by the plug element 34 when the meter plug is inserted in the base extension socket. A tampering condition is thus indicated at the microprocessor input when the voltage thereof is at ground potential.

Figure 4:
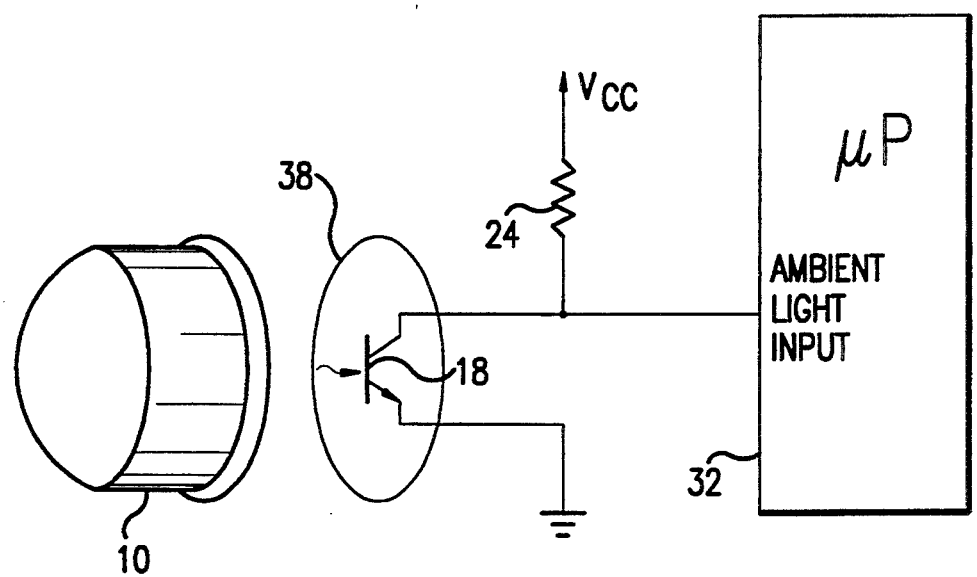
FIG. 4 is a schematic diagram of a meter tampering detection circuit illustrating an optical sensor, arranged to detect ambient light in the absence of the meter.

FIG. 4 illustrates a further embodiment of a meter tampering detection arrangement according to the invention. As in the circuit shown in FIGS. 1 and 2, phototransistor 18 is connected between the voltage supply $V_{CC}$ and ground through the series connection of resistor 24. The microprocessor input is connected to the junction between the resistor 24 and the phototransistor. The phototransistor is physically positioned at the surface 38 of the base extension. When the meter is engaged with the base extension ambient light paths to the phototransistor are obstructed. When the meter is removed from the base extension during daytime conditions of high ambient light, the phototransistor is conductive and the ground potential that is thereby applied to the microprocessor input terminal is indicative of a meter tampering condition.

Figure 5:
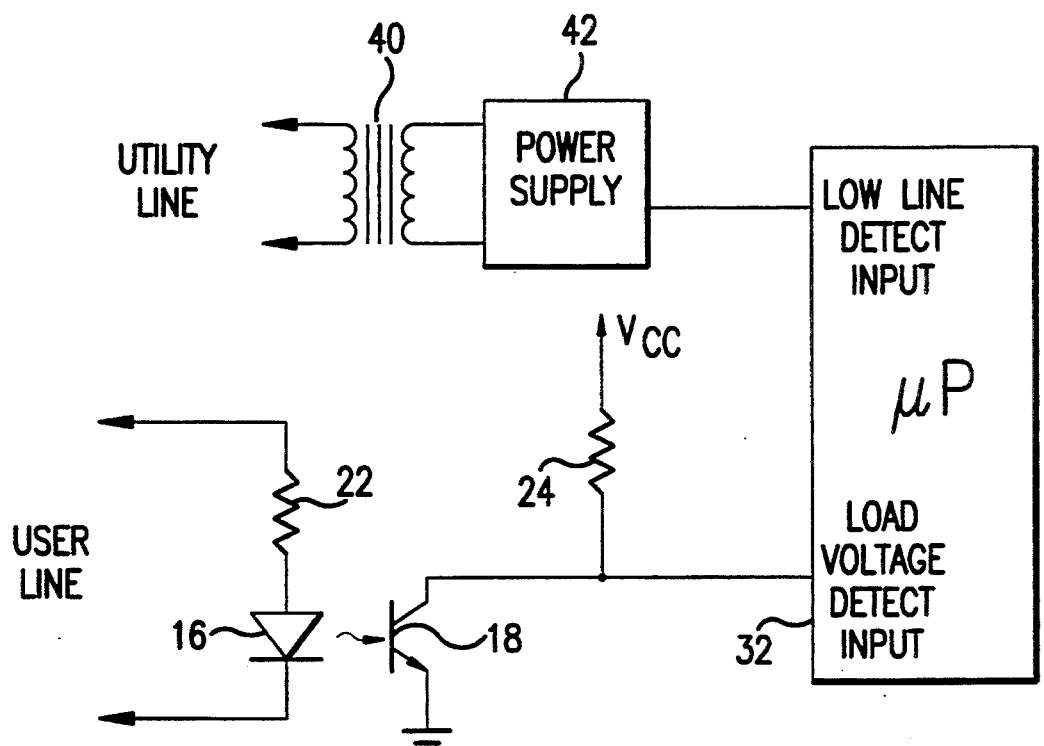
FIG. 5 is a schematic diagram of a meter tampering detection circuit according to the invention wherein both utility line voltage and user line voltage are sensed.

FIG. 5 illustrates a meter tampering detection circuit according to the invention wherein the presence or absence of utility line voltage and user line voltage are sensed. The meter interrogation unit, including microprocessor 32, which is also used for power usage reading, derives power from the utility line through transformer 40. Power supply 42 is connected to the transformer secondary. Voltage on the user line side of the meter is detected by an optical isolator, including light emitting diode 16 and phototransistor 18. Other means, such as an additional transformer, may be used in place of the optical isolator.

When the meter is removed, no voltage is applied to the user line through the meter. The presence of voltage at the utility line side is detected from power supply 42 at the microprocessor input. The absence of voltage at the user line results in nonconduction of the phototransistor, whereby a voltage at the supply voltage level is detected at the load voltage detect input to the microprocessor. The detection of supply voltage states at both microprocessor inputs is an indication of meter tampering. Such indication can be transmitted to a remote location of the utility company.

Figure 6:
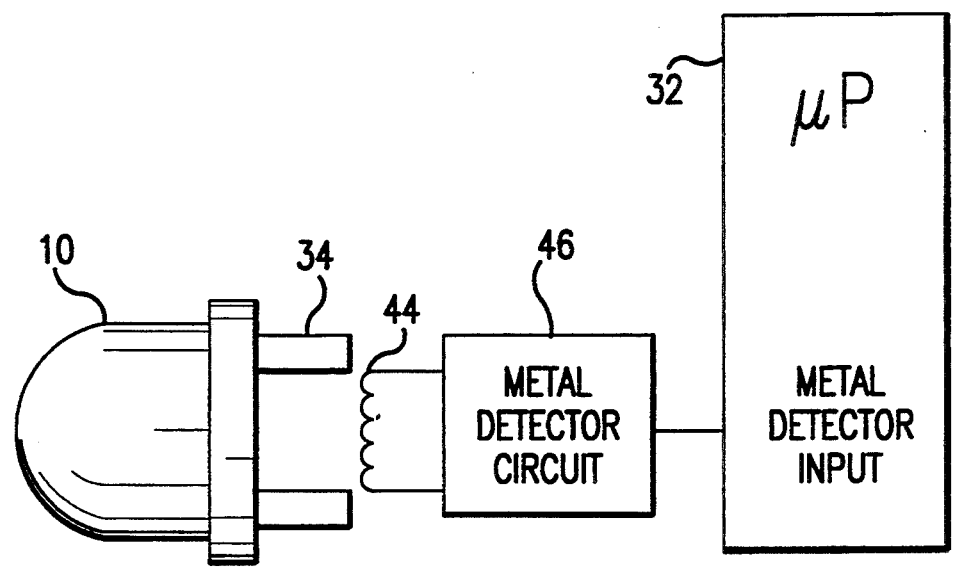
FIG. 6 is a schematic diagram of a meter tampering detection circuit according to the invention wherein a metal detector, normally in close proximity to the meter, senses the presence or absence of the meter.

FIG. 6 illustrates a meter tampering detection circuit according to the present invention wherein a metal detection circuit 46 within the base extension senses the proximity of the meter frame through inductive pickup 44. The metal detector circuit may be any of well known available circuits and may include an application specific integrated circuit in the meter base extension. An output voltage level of the detector circuit, which represents absence of the meter, is an indication of meter tampering.

In summary, there has been disclosed several methods and circuit arrangements for the detection of electricity meter tampering wherein such detection is determined externally of the meter. Remote interrogation of the external circuit may be made by the utility company to monitor the tampering condition.

In this disclosure there is shown and described only the preferred embodiments of the invention and but a few examples of its versatility. It is to be understood that the invention is capable of use in various other combinations and environments and is capable of changes or modifications within the scope of the inventive concept as expressed herein.

What is claimed is:

1. A device for detecting tampering of a connection between an electricity meter and an external power supply system, said device comprising:
   means for detecting voltage of power supplied to said meter from said external power supply system;
   means for detecting voltage of power output from said meter to a load circuit; and
   means including a microprocessor for detecting a meter tampering condition in response to the detected power supply voltage and the detected load circuit voltage.

2. A device as recited in claim 1, wherein said means for detecting voltage of power supplied to said meter comprises a transformer having a primary winding disposed across lines from said external power supply system to said meter and having a secondary winding configured to communicate with said microprocessor.

3. A device as recited in claim 1, wherein said means for detecting voltage of power output from said meter comprises a phototransistor in communication with said microprocessor and a light emitting diode situated across lines from said meter to said load circuit and positioned to radiate light to said phototransistor.

4. A method for ascertaining tampering of a connection between an electricity meter and an external power supply system, comprising the steps of:
   detecting voltage of power supplied to said meter from said power supply system;
   detecting voltage of power output from said meter to a load circuit; and
   indicating a meter tampering condition when said voltage of power supplied to said meter from the power supply system is relatively high and said voltage of power output to said load circuit is relatively low.

5. A method as recited in claim 4, further comprising the step of detecting said voltage of power supplied to said meter using a transformer having a winding connected across lines for supplying power to said meter.

6. A method as recited in claim 4, further comprising the step of receiving light from a light emitting diode situated across lines from said meter to said load circuit in order to detect said voltage of power output from said meter.

* * * * *